US 7,094,613 B2

United States Patent
Mui et al.

(10) Patent No.: US 7,094,613 B2
(45) Date of Patent: Aug. 22, 2006

(54) METHOD FOR CONTROLLING ACCURACY AND REPEATABILITY OF AN ETCH PROCESS

(75) Inventors: David Mui, Fremont, CA (US); Wei Liu, San Jose, CA (US); Hiroki Sasano, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 189 days.

(21) Appl. No.: 10/690,318

(22) Filed: Oct. 21, 2003

(65) Prior Publication Data

US 2005/0085090 A1    Apr. 21, 2005

(51) Int. Cl.
*H01L 21/00* (2006.01)

(52) U.S. Cl. .............................. 438/9; 438/16; 438/714; 438/719; 438/725; 216/60; 216/67; 216/79

(58) Field of Classification Search .................... 430/5; 438/5, 9, 14, 16, 714, 719–721, 723, 724, 438/740, 743, 744; 216/60, 67, 70
See application file for complete search history.

(56) References Cited

U.S. PATENT DOCUMENTS

| | | | |
|---|---|---|---|
| 5,926,690 A | 7/1999 | Toprac et al. .................. | 438/17 |
| 5,948,203 A | 9/1999 | Wang ........................... | 156/345 |
| 6,161,054 A | 12/2000 | Rosenthal et al. ........... | 700/121 |
| 6,242,350 B1 * | 6/2001 | Tao et al. ..................... | 438/690 |
| 6,245,581 B1 * | 6/2001 | Bonser et al. ................. | 438/8 |
| 6,424,417 B1 | 7/2002 | Cohen et al. ................ | 356/388 |
| 6,433,871 B1 * | 8/2002 | Lensing et al. .............. | 356/450 |
| 6,479,200 B1 * | 11/2002 | Stirton ......................... | 430/30 |
| 6,479,309 B1 | 11/2002 | Wright ........................ | 438/16 |
| 6,486,492 B1 | 11/2002 | Su .............................. | 257/48 |
| 6,501,555 B1 | 12/2002 | Ghandehari et al. ........ | 356/630 |
| 6,620,631 B1 * | 9/2003 | Tao et al. ..................... | 438/9 |
| 6,707,562 B1 * | 3/2004 | Lensing ...................... | 356/630 |
| 2002/0072003 A1 | 6/2002 | Brill et al. .................... | 430/30 |
| 2002/0171828 A1 | 11/2002 | Cohen et al. ............... | 356/328 |
| 2003/0000922 A1 | 1/2003 | Subramanian et al. ........ | 216/60 |
| 2005/0064714 A1 * | 3/2005 | Mui et al. .................... | 438/706 |

FOREIGN PATENT DOCUMENTS

WO        03/003447        1/2003

OTHER PUBLICATIONS

Lee, et al., "Analysis of Reflectometry and Ellipsometry Data from Patterned Structures," Characterization and Metrology for UCSI Technology: 1998 International Conference, Seiler, et al., eds., p. 331-335.

(Continued)

*Primary Examiner*—Nadine G. Norton
*Assistant Examiner*—Eric B. Chen
(74) *Attorney, Agent, or Firm*—Patterson & Sheridan LLP

(57) ABSTRACT

Embodiments of the invention generally relate to a method for etching in a processing platform (e.g. a cluster tool) wherein robust pre-etch and post-etch data may be obtained in-situ. The method includes the steps of obtaining pre-etched critical dimension (CD) measurements of a feature on a substrate, etching the feature; treating the etched substrate to reduce and/or remove sidewall polymers deposited on the feature during etching, and obtaining post-etched CD measurements. The CD measurements may be utilized to adjust the etch process to improved the accuracy and repeatability of device fabrication.

20 Claims, 6 Drawing Sheets

OTHER PUBLICATIONS

Raymond, "Angle-resolved scatterometry for semiconductor manufacture,", Microlithography World, Winter 2000.

Toprac, A., "AMD's Advanced Process Control of Ply-Gate Critical Dimension," Proc. SPIE vol. 3882, p. 62-65, Sep. 1999.

Yang, et al., "Line-profile and Critical Dimension Measurements Using a Normal Incidence Optical Metrology System," Proceedings of SPIE vol. 4689, Mar. 2002.

* cited by examiner

METHOD FOR CONTROLLING ACCURACY AND REPEATABILITY OF AN ETCH PROCESS

BACKGROUND OF THE INVENTION

1. Field of the Invention

The present invention generally relates to semiconductor substrate processing systems. More specifically, the present invention relates to controlling accuracy and repeatability of etch processes in a semiconductor substrate processing system.

2. Description of the Related Art

To increase operational speed, devices (e.g., transistors, capacitors, and the like) in integrated microelectronic circuits have become ever smaller. One method for fabricating such devices comprises forming a patterned mask (e.g., photoresist mask) on a material layer disposed beneath such a mask (i.e., on an underlying layer) and then etching the material layer using the patterned photoresist mask as an etch mask. The etch mask generally is a replica of the structure to be formed (i.e., etched) in the underlying layer (or layers). As such, the etch mask has the same topographic dimensions as the structures being formed in the underlying layer(s).

Manufacturing variables of an etch process may result in a broad statistical distribution (i.e., large σ (sigma), where σ is a standard deviation) for the dimensions of the structures formed within a group (i.e., batch or lot) of wafers being etched. One method of controlling accuracy and repeatability for an etch process comprises measuring the smallest widths of elements of etch masks and formed structures, such as lines, columns, openings, spaces between the lines, and the like. Such smallest widths are known as "critical dimensions", or CDs. In advanced ultra large scale integrated (ULSI) circuits, the critical dimensions are generally sub-micron dimensions of about 20 to 200 nm.

Parameters of the etch process recipe are generally selected using statistically generated results of critical dimension measurements for the patterned photoresist masks formed on wafers to be etched. After the etch process, the patterned photoresist masks are removed along with post-etch residues, the dimensions of the etched structures are measured and averaged, and the results are used to adjust subsequent etch process recipes. Conventionally, photoresist masks and post-etch residues are removed using wet stripping processes. The wet stripping processes are performed ex-situ and, as such, there is a significant delay (e.g., 1–2 hours) for receiving corrective feedback for improving the accuracy and repeatability of etch processes subsequently performed.

Therefore, there is a need in the art for an improved method for controlling accuracy and repeatability of an etch process during fabrication of semiconductor devices in a semiconductor substrate processing system.

SUMMARY OF THE INVENTION

The present invention is a method for controlling accuracy and repeatability of an etch process. Embodiments of the invention are practiced on a processing platform (e.g. a cluster tool) wherein robust pre-etch and post-etch data may be obtained in-situ. The method includes the steps of obtaining pre-etched critical dimension (CD) measurements of a feature on a substrate, etching the feature; treating the etched substrate to reduce and/or remove sidewall polymers deposited on the feature during etching, and obtaining post-etched CD measurements. The CD measurements may be utilized to adjust the etch process to improved the accuracy and repeatability of device fabrication.

In another embodiment of the invention, a method for etching comprises measuring dimensions of portions of a patterned mask, trimming the patterned mask using a process recipe based on these measurements, etching one or more layers on a substrate using the trimmed patterned mask as an etch mask, measuring dimensions of etched structures, and adjusting the trimming recipe or/and the etch recipe for subsequent substrates based on the post-etch measurements. The post-etch measurements are performed using an optical scatterometry measuring technique after sidewall residues have been reduced. As such, the post-etch measurements may be performed immediately after the substrate has been etched (e.g., prior to any wet post-etch clean procedure) to provide the real time feedback and process monitoring data to be used for etching subsequent substrates. In one application, the method is used to control accuracy and repeatability of etching a gate structure of a field effect transistor.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention generally relate to a method for etching in a processing platform (e.g., a cluster tool) wherein robust pre-etch and post-etch data may be obtained in-situ. The method includes the steps of obtaining pre-etched critical dimension (CD) measurements of a feature on a substrate, etching the feature, treating the etched substrate to reduce and/or remove sidewall polymers deposited on the feature during etching, and obtaining post-etched CD measurements. The CD measurements may be utilized to adjust the etch process to improved the accuracy and repeatability of device fabrication.

The present invention allows for the accuracy and precision of an etch process to be adjusted wafer to wafer, thereby enhancing process repeatability. The invention is generally used during fabrication of ultra-large-scale integrated (ULSI) semiconductor devices and circuits in a semiconductor substrate processing system.

Figure 1:
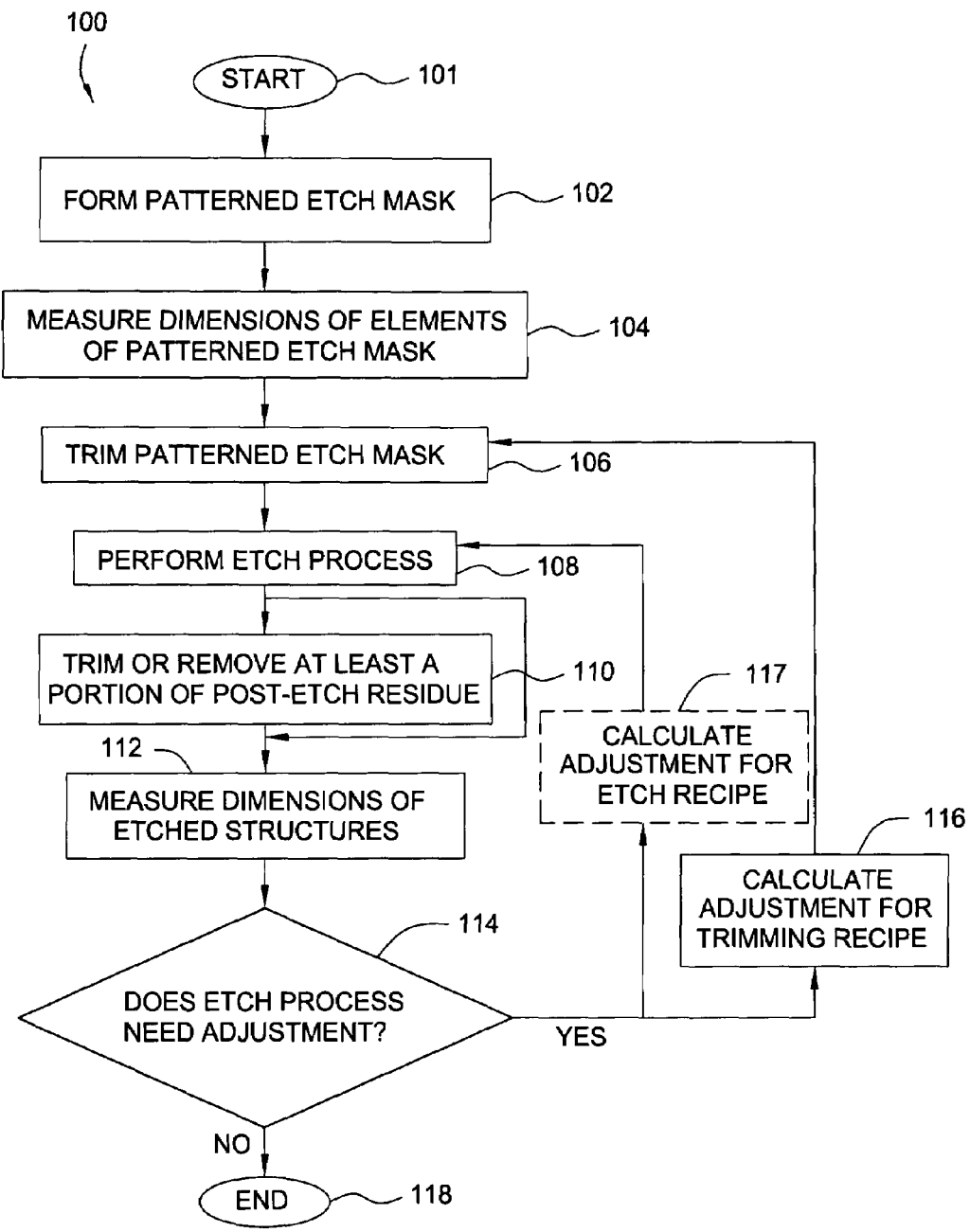
FIG. 1 depicts a flow diagram of a method for controlling accuracy and repeatability of an etch process in accordance with one embodiment of the present invention.

FIG. 1 depicts a flow diagram of one embodiment of the inventive method for controlling accuracy and repeatability of an etch process as sequence 100. The sequence 100 includes the processes that are performed upon a film during an etch process.

FIGS. 2A–2D depict a series of schematic, cross-sectional views of a substrate having a gate structure of a field effect transistor being fabricated where accuracy and repeatability of etching a gate electrode are controlled using the processes of sequence 100. The cross-sectional views in FIGS. 2A–2D are not depicted to scale and are simplified for illustrative purposes. To best understand the invention, the reader should simultaneously refer to FIG. 1 and FIGS. 2A–2D.

In one illustrative application, a gate electrode of a field effect transistor, such as a complementary metal-oxide-semiconductor (CMOS) field effect transistor, and the like, is etched using sequence 100.

Figure 2A:
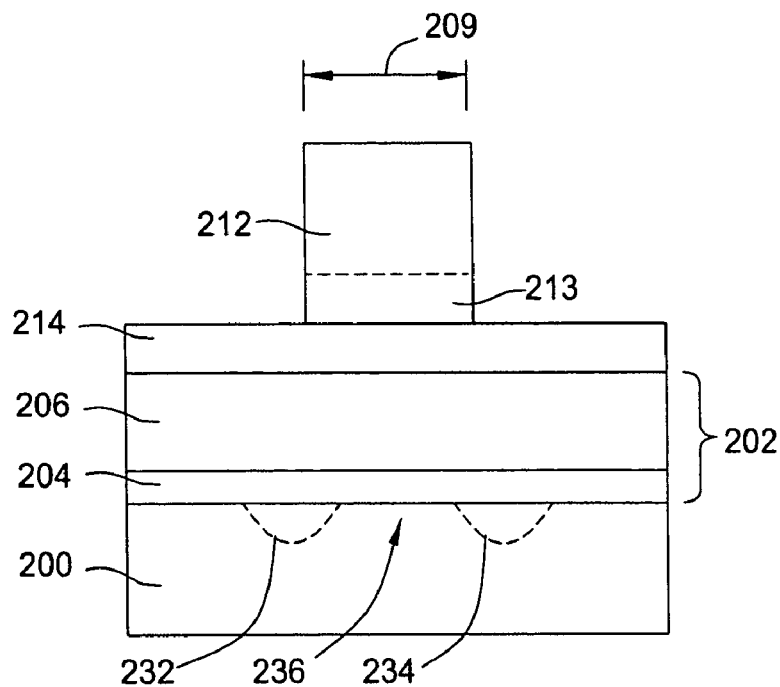
FIGS. 2A–2D depict a series of schematic, cross-sectional views of a substrate having a gate structure of a field effect transistor being formed in accordance with the method of FIG. 1.

The sequence 100 starts at step 101 and proceeds to step 102 when a patterned mask 212 (e.g., photoresist patterned mask) is formed on a substrate 200 (FIG. 2A). The patterned mask 212 may also comprise an optional film of an anti-reflective coating (ARC) 213 (shown only in FIG. 2A, with dashed lines). The substrate 200, e.g., a silicon (Si) wafer, has regions 232 and regions 234 (both regions are depicted using broken lines) where the sources and drains will be formed using an ion implant process after the gate structure is completed. The source and drain regions 232, 234 are separated by a channel region 236 in each of the transistors being manufactured. The substrate 200 further comprises a film stack 202 in which the gate structure is to be formed thereon and an optional hard mask layer 214. The film stack 202 generally includes a gate electrode layer 206 and a gate dielectric layer 204.

In one exemplary embodiment, the gate electrode layer 206 is formed of doped polysilicon (Si) to a thickness of about 500 to 3000 Angstroms and the gate dielectric layer 204 is formed of a dielectric material such as silicon dioxide ($SiO_2$) to a thickness of about 10 to 60 Angstroms. Alternatively, the gate dielectric layer 204 may comprise one or more high-K dielectric materials having a dielectric constant greater than 4.0, such as hafnium dioxide ($HfO_2$), hafnium silicon dioxide ($HfSiO_2$), hafnium silicon oxynitride (HfSiON), barium strontium titanate ($BaSrTiO_3$, or BST), lead zirconate titanate ($Pb(ZrTi)O_3$, or PZT), and the like. It should be noted, however, that the film stack 202 may comprise layers formed of other materials, as well as layers having different thicknesses.

The hard mask layer 214 may comprise, for example, silicon dioxide ($SiO_2$), n-doped silicon dioxide, silicon oxynitride ($SiO_xN_y$, where x and y are integers), silicon nitride ($Si_3N_4$), hafnium dioxide ($HfO_2$), amorphous carbon (i.e., α-carbon), and the like.

The layers of the film stack 202, as well as the hard mask layer 214, may be formed using any conventional deposition technique, such as atomic layer deposition (ALD), physical vapor deposition (PVD), chemical vapor deposition (CVD), plasma enhanced CVD (PECVD), and the like. Fabrication of the CMOS field effect transistor may be performed using the respective processing modules of CENTURA®, ENDURA®, and other semiconductor wafer processing systems available from Applied Materials, Inc. of Santa Clara, Calif.

When the hard mask layer 214 is present, the patterned mask 212 is generally used as an etch mask for fabricating a hard mask 219 and etching the gate electrode layer 206. The hard mask 219 is then used as an etch mask for etching the gate dielectric layer 204.

The photoresist mask 212 may be formed using a lithographic process. Due to optical limitations of the lithographic process, the photoresist mask generally is formed as a scaled-up replica of the structure to be etched in the underlying layer or layers. In the depicted embodiment, the photoresist mask, as formed, has a smallest width 209 that is greater than the width of the structure to be etched. After the lithographic process, the photoresist mask 212 is trimmed to a predetermined width 211 (discussed below in reference to step 106 and FIG. 2B) before the mask is used as an etch mask to etch the hard mask layer 214 or the film stack 202.

At step 104, the dimensions of the patterned mask 212 having the smallest widths 209 (i.e., critical dimensions, or CDs) are measured on each substrate of a batch (or lot) of substrates that are to be etched. Such measurements (i.e., pre-etch measurements) may be performed using, for example, an optical measuring tool. Generally, the optical measuring tool uses one or more non-destructive measuring techniques, such as spectroscopy, interferometry, scatterometry, reflectometry, ellipsometry, and the like. Such optical measuring tool may be a component of an integrated semiconductor wafer processing system. In one exemplary embodiment, the optical measuring tool is the TRANSFORMA™ measuring system of the CENTURA® system and is configured for performing critical dimensions (CDs) measurements using a scatterometric measuring technique.

The TRANSFORMA™ measuring system is available from Applied Materials, Inc. of Santa Clara, Calif. and is disclosed in commonly assigned U.S. Pat. No. 6,486,492, issued Nov. 26, 2002, which is incorporated herein by reference. The measurements of the critical dimensions are generally performed in a statistically significant number of regions (e.g., 5 to 9 or more regions) of the substrate, and then averaged for each substrate.

Figure 2B:
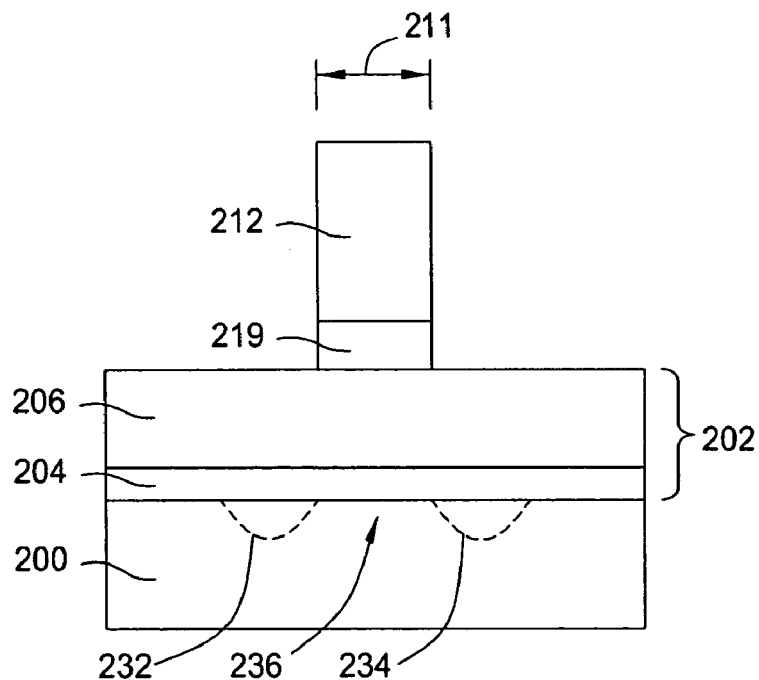

At step 106, the patterned etch mask 212 is trimmed to the predetermined width 211 (FIG. 2B). Step 106 uses a trimming process recipe that is defined based on the results of pre-etch measurements performed during step 104. Specifically, the results of these measurements may be used by a processor of a system controller of the semiconductor wafer processing system or, alternatively, a processor of a controller of the etch reactor, to define the trimming process recipe to be used for trimming patterned etch mask 212 to the width 211.

The trimming process is generally an isotropic etch process (e.g., isotropic plasma etch process) that is performed upon the photoresist mask 212 to reduce the width 209 thereof. One exemplary trimming process is described, for example, in commonly assigned U.S. patent application Ser. No. 10/338,251, filed Jan. 6, 2003, which is incorporated herein by reference. Referring to FIG. 2B, the patterned mask 212 is trimmed to the width 211 that is smaller than the width 209 (shown in FIG. 2A) of the lithographically patterned mask 212.

The trimming process may be performed using a plasma etch reactor, e.g., a Decoupled Plasma Source (DPS) II module of the CENTURA® system. The DPS II module (discussed with reference to FIG. 3 below) uses a power source (i.e., an inductively coupled antenna) to produce a high-density inductively coupled plasma. To determine the endpoint of the etch process, the DPS II module may also include an endpoint detection system that monitors plasma emissions at a particular wavelength, controls the process time, or performs laser interferometery, and the like.

When the optional anti-reflective coating (ARC) 213 or hard mask layer 214 is present, such layers may be contemporaneously etched in the same etch reactor. The ARC 213 formed from organic materials (e.g., polyamides, polysulfones, and the like) may be etched and trimmed to the width 211 simultaneously with the photoresist mask 212. The ARC 213 that is formed from inorganic materials (e.g., silicon nitride ($Si_3N_4$), silicon oxynitride (SiON), silicon carbide (SiC), and the like) and the hard mask layer 214 may be anisotropically etched to the width 211 in the etch reactor (i.e., in-situ) using any conventional process recipe that is suitable for etching such layers using the trimmed photoresist patterned mask 212 as an etch mask. Alternatively, the inorganic ARC layer 213 or the hard mask layer 214 may be etched contemporaneously with the underlying gate electrode layer 206.

At step 108, underlying layer(s) of the film stack 202 is (are) etched using any conventional etchant(s) suitable to etch the layer(s). Generally, such etch processes produce some non-volatile by-products which may form post-etch residues (i.e., polymeric post-etch residue) on sidewalls of the etched structures, as well as elsewhere on the substrate being etched.

Figure 2C:
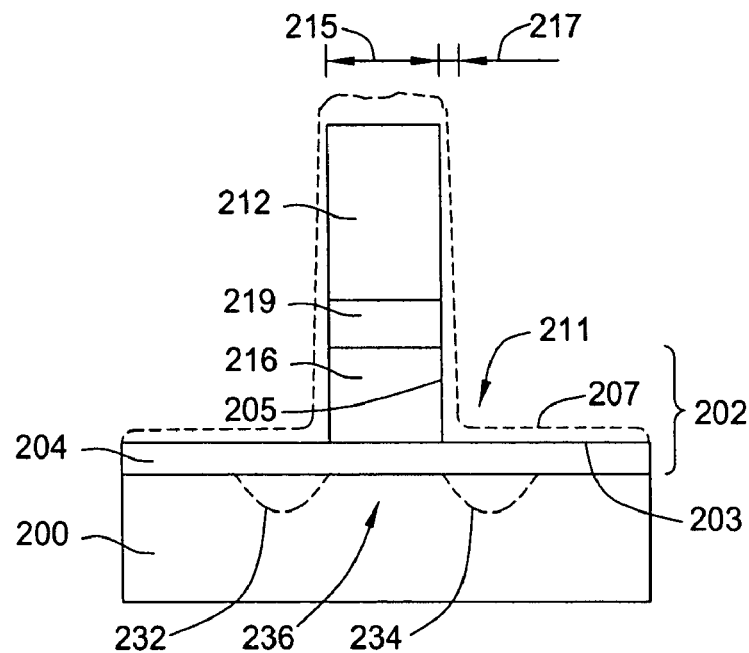

Referring to FIG. 2C, at step 108, the polysilicon (Si) gate electrode layer 206 is plasma etched to form a gate electrode 216. The gate electrode layer 206 may be plasma etched using a halogen-containing gas mixture comprising one or more halogen-containing gases such as chlorine ($Cl_2$), hydrogen bromide (HBr), carbon tetrafluoride ($CF_4$), and the like, as well as an oxygen-containing gas (e.g., oxygen ($O_2$) a mixture of helium (He) and oxygen ($O_2$) (i.e., He—$O_2$), and the like). The oxygen-containing gas forms a passivating oxide film on sidewalls of the gate electrode 216. The halogen-containing gas mixture may optionally include an inert diluent gas such as at least one of nitrogen ($N_2$), argon (Ar), helium (He), neon (Ne), and the like. In one embodiment, step 108 uses the photoresist mask 212 as an etch mask and the gate dielectric layer 204 (e.g., hafnium dioxide layer) as an etch stop layer.

In one illustrative embodiment, the gate electrode layer 206 comprising polysilicon is etched in the DPS II module by providing hydrogen bromide (HBr) at a flow rate of 20 to 300 sccm, chlorine ($Cl_2$) at a flow rate of 20 to 300 sccm (i.e., a HBr:$Cl_2$ flow ratio ranging from 1:15 to 15:1), and nitrogen ($N_2$) at a flow rate of 0 to 200 sccm, applying power to an inductively coupled antenna between 200 and 3000 W, applying a cathode bias power between 0 and 300 W and maintaining a wafer temperature between 20 and 80 degrees Celsius at a pressure in the process chamber between 2 and 100 mTorr. One exemplary process provides HBr at a flow rate of 40 sccm, $Cl_2$ at a flow rate of 40 sccm (i.e., a HBr:$Cl_2$ flow ratio of about 1:1), $N_2$ at a flow rate of 20 sccm, applies 1100 W of power to the antenna, 20 W of cathode bias power and maintains a wafer temperature of 45 degrees Celsius at a chamber pressure of 45 mTorr. Such a process provides etch selectivity for polysilicon (layer 206) over hafnium dioxide (layer 204) of at least 100:1, as well as etch selectivity for polysilicon over photoresist (mask 212) of about 3:1.

During step 108, a portion of the material removed from the gate electrode layer 206 combines with components of the etchant gas mixture (e.g., halogen-containing gases) as well as components of the mask 212 forming non-volatile compounds. Such non-volatile compounds may become redeposited onto the substrate 200, forming a polymeric residue layer 207 (shown with broken lines in FIG. 2C). The polymeric residue layer 207 is typically formed on sidewalls 205 of the gate electrode 216, the surface 203 of the gate dielectric layer 204, and elsewhere on the substrate 200. The residue layer 207 may typically have a thickness 217 of about 10 to 400 Angstroms, wherein the layer 207 generally has the least thickness on the sidewalls 205. To provide accurate post-etch measurements of a width 215 of the gate electrode 216, the measuring technique should not be carried out unless and until the thickness of the sidewall residue is acceptable as described below. One such measuring technique, for example, is optical scatterometry. If the sidewall depositions (e.g., polymeric residue layer 207) have a thickness of not greater than about 10 nm, the optical scatterometric measuring technique may be performed without post-etch treatment. Therefore, using the TRANSFORMA™ measuring system, the critical dimensions of structures formed during etch step 108 may be accurately measured when a thickness of the polymeric residue on sidewalls thereof is not greater than about 10 nm.

When, after step 108, the thickness 217 of the polymeric layer 207 on sidewalls 205 is less or about 10 nm, the sequence proceeds to step 112. Alternatively, when the thickness 217 is greater than 10 nm, the sequence 100 proceeds to step 110.

Figure 2D:
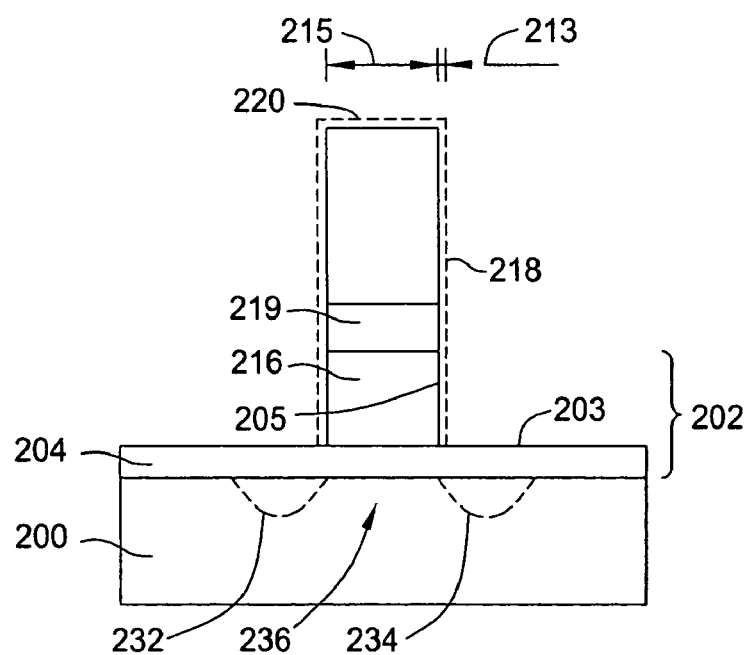

At step 110, the polymeric residue layer 207, as well as the photoresist mask 212, is compacted/outgassed or at least a portion of the layer 207 is removed using a plasma strip process (FIG. 2D). Step 110 generally thins and/or increases density of the polymeric residue layer 207. Such a step may have a broad process window since the amount of the polymeric residue to be removed is variable.

In one exemplary embodiment, the strip process uses a gas mixture comprising nitrogen ($N_2$) and hydrogen ($H_2$) or optionally, nitrogen ($N_2$) and oxygen ($O_2$). Step 110 may leave on sidewalls 205 of the polysilicon electrode traces 218 of residue having a thickness 213 of not greater than about 10 nm, as well as traces 220 of the photoresist mask 212 (traces 218, 220 are shown in FIG. 2D with broken lines).

The strip process may be performed using, e.g., the AXIOM™ module (available from Applied Materials, Inc. of Santa Clara, Calif.) of the CENTURA® system. The AXIOM™ module is a remote plasma reactor in which a radio-frequency (RF) plasma is confined such that only reactive neutrals are allowed to enter a reaction volume of the process chamber. Such a confinement scheme precludes plasma-related damage of the substrate or circuits formed on the substrate. Similar to the DPS II reactor, the AXIOM™ module may use an endpoint detection system. The AXIOM™ module is described in detail in U.S. patent application Ser. No. 10/264,664, filed Oct. 4, 2002, which is herein incorporated by reference. The salient features of the reactor are briefly described below with reference to FIG. 4. Alternatively, the strip process may be performed using the DPS II module.

In one illustrative embodiment, the polymeric residue layer 207 and photoresist mask 212 are compacted/outgassed using the AXIOM™ module by providing nitrogen ($N_2$) at a flow rate of 300 to 1000 sccm, hydrogen ($H_2$) at a flow rate of 0 to 100 sccm (i.e., a $N_2$:$H_2$ flow ratio ranging from 3:1 to 100% $N_2$), and oxygen ($O_2$) at a flow rate of 1000 to 5000 sccm, applying power to an inductively coupled power source between about 1000 to 7000 W at about 200 to 600 kHz to form the remote plasma and maintaining a wafer temperature between 200 and 350 degrees Celsius at a pressure in the process chamber between 500 and 2000 mTorr. One exemplary process provides $N_2$ at a flow rate of 768 sccm, $H_2$ at a flow rate of 32 sccm (i.e., a $N_2$:$H_2$ flow ratio of about 24:1), and $O_2$ at a flow rate of 3500 sccm, applies 5000 W of power to the inductive power source to form the remote plasma and maintains a wafer temperature of 250 degrees Celsius at a chamber pressure of 750 mTorr.

At step 112, the critical dimensions of the etched structures are measured on each substrate being processed. Similar to the measurements performed during step 104, such post-etch measurements of critical dimensions are generally performed in a statistically significant number of regions on the substrate (e.g., 5 to 9 or more regions) and then averaged for each such substrate. Generally, such measurements are performed using the same measuring tool and the methodology as the measurements described above with reference to step 104. In one exemplary embodiment, step 112 uses the TRANSFORMA™ measuring system configured for performing such measurements using the optical scatterometric measuring technique.

At step 114, the sequence 100 queries if the critical dimensions of the etched structures on the substrate are different from the pre-determined dimensions and, as such, whether the etch process recipe of step 106 should be adjusted to compensate for manufacturing variables of the etch process of step 108. The manufacturing variables of the etch process of step 108 may relate, e.g., to the temperature of the walls of the etch chamber, maintenance status of the etch reactor, deposition of etch by-products, and the like. If the query of step 114 is affirmatively answered, the sequence 100 proceeds to step 116.

At step 116, the measured dimensions (e.g., critical dimensions) of the etched structures are averaged and the processor of the system controller of the integrated semiconductor wafer processing system or, alternatively, the processor of the controller of the etch reactors calculates an adjustment for the trimming process recipe to be used at step 106 for trimming the patterned masks 212 of the subsequent substrate (or substrates).

Calculations of the adjustment to the trimming process recipe may be based on the results of post-etch measurements performed, at step 112, on one of preceding substrates or, alternatively, on averaged results of such measurements performed on a group of the preceding substrates. In one embodiment, such an adjustment comprises modifying a duration of the trimming process or modifying other process parameters for the trimming process (e.g., a flow rate and/or pressure of an etchant gas or gases, a plasma source power, a substrate bias power, and the like). During processing of one or more subsequent substrates, the adjusted trimming process facilitates forming gate structures having the pre-determined critical dimensions.

In an alternate embodiment, at optional step 117, the processor of the system controller of the integrated semiconductor wafer processing system or, alternatively, the processor of the controller of the etch reactor, calculates an adjustment for the etch process recipe to be used to etch, at step 108, at least one subsequent substrate. Similar to step 116, such calculations may be based on the results of the post-etch measurements performed, at step 112, on one of more preceding substrates. To facilitate fabricating gate structures having pre-determined critical dimensions, such an adjustment comprises modifying a duration of the etch process or modifying other process parameters of the etch process. In one embodiment, such process parameters include a flow rate and/or pressure of an etchant gas or gases, a plasma source power, a substrate bias power, and the like.

In a further embodiment, at steps 116 and 117, the processor of the system controller of the integrated semiconductor wafer processing system calculates adjustments for both the trimming process recipe of step 106 and the etch process recipe of step 108, respectively. Each such adjustment compensates for a portion of the manufacturing variables of the etch process of step 108 and, together, they supplement each other in providing efficient compensation of the manufacturing variables.

Referring to FIG. 2D, at step 112, the width 215 of the polysilicon electrode 216 is measured in a statistically significant number of regions of the substrate and then averaged. Then, at step 114, the sequence 110 queries whether the width 215 is different from a pre-determined value of the width for the polysilicon electrode 216. If such a query is affirmatively answered, at step 116, an adjustment for the trimming process of step 106 or, alternatively, at step 117, an adjustment for the etch process of step 108 is calculated for use when etching one or more subsequent substrates of same batch of the substrates.

If the query of step 114 is negatively answered, the sequence 100 proceeds to step 118. At step 118, the sequence 100 ends. As such, the sequence 100 provides close-loop control of the etch process and facilitates fabrication of structures having high dimensional accuracy within the batch of substrates. One skilled in the art will appreciate that same method may be sequentially applied to etch one or more layers (e.g., gate dielectric layer 204) disposed beneath the layer (i.e., gate electrode layer 206) that was etched using the sequence 100.

Figure 3:
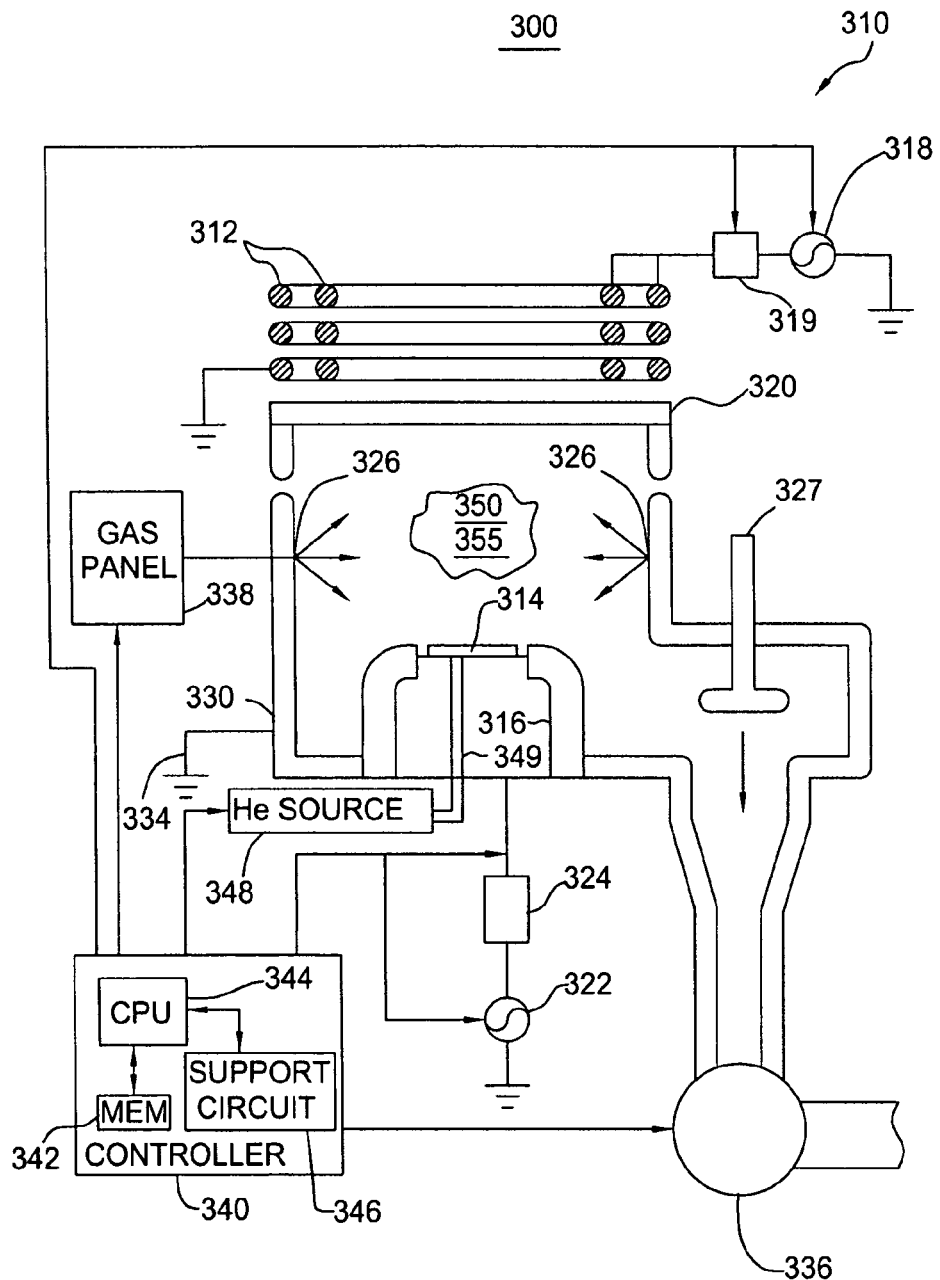
FIG. 3 depicts a schematic diagram of an exemplary etch apparatus of the kind used in performing portions of the inventive method.

FIG. 3 depicts a schematic diagram of the exemplary Decoupled Plasma Source (DPS) etch reactor 300 that may be used to practice portions of the invention. The DPS II reactor is generally used as a processing module of the CENTURA® processing system available from Applied Materials, Inc. of Santa Clara, Calif.

The reactor 300 comprises a process chamber 310 having a wafer support pedestal 316 within a conductive body (wall) 330, and a controller 340.

The chamber 310 is supplied with a substantially flat dielectric ceiling 320. Other modifications of the chamber 310 may have other types of ceilings, e.g., a dome-shaped ceiling. Above the ceiling 320 is disposed an antenna comprising at least one inductive coil element 312 (two co-axial elements 312 are shown). The inductive coil element 312 is coupled, through a first matching network 319, to a plasma power source 318. The plasma source 318 typically is capable of producing up to 3000 W at a tunable frequency in a range from 50 kHz to 13.56 MHz.

The support pedestal (cathode) 316 is coupled, through a second matching network 324, to a biasing power source 322. The biasing power source 322 generally is capable of producing up to 10 kW at a frequency of approximately 13.56 MHz. The biasing power may be either continuous or pulsed power. In other embodiments, the biasing power source 322 may be a DC or pulsed DC source.

The controller 340 comprises a central processing unit (CPU) 344, a memory 342, and support circuits 346 for the CPU 344 and facilitates control of the components of the chamber 310 and, as such, of the etch process, as discussed below in further detail.

In operation, a semiconductor wafer 314 is placed on the pedestal 316 and process gases are supplied from a gas panel 338 through entry ports 326 to form a gaseous mixture 350. The gaseous mixture 350 is ignited into a plasma 355 in the chamber 310 by applying power from the plasma source 318 and biasing source power 322 to the inductive coil element 312 and the cathode 316, respectively. The pressure within the interior of the chamber 310 is controlled using a throttle valve 327 and a vacuum pump 336. Typically, the chamber wall 330 is coupled to an electrical ground 334. The temperature of the wall 330 is controlled using liquid-containing conduits (not shown) that run through the wall 330.

The temperature of the wafer 314 is controlled by stabilizing a temperature of the support pedestal 316. In one embodiment, helium gas from a gas source 348 is provided via a gas conduit 349 to channels (not shown) formed in the pedestal surface under the wafer 314. The helium gas is used to facilitate heat transfer between the pedestal 316 and the wafer 314. During processing, the pedestal 316 may be heated by a resistive heater (not shown) within the pedestal to a steady-state temperature and then the helium gas facilitates uniform heating of the wafer 314. Using such thermal control, the wafer 314 is maintained at a temperature between about 20 to 350 degrees Celsius.

Those skilled in the art will understand that other etch chambers may be used to practice the invention, including chambers with remote plasma sources, electron cyclotron resonance (ECR) plasma chambers, and the like.

To facilitate control of the process chamber 310 as described above, the controller 340 may be one of any form of general-purpose computer processor that can be used in an industrial setting for controlling various chambers and sub-processors. The memory 342, or computer-readable medium, of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method is generally stored in the memory 342 as a software routine. The software routine may also be stored and/or executed by a second CPU (not shown) that is remotely located from the hardware being controlled by the CPU 344.

Figure 4:
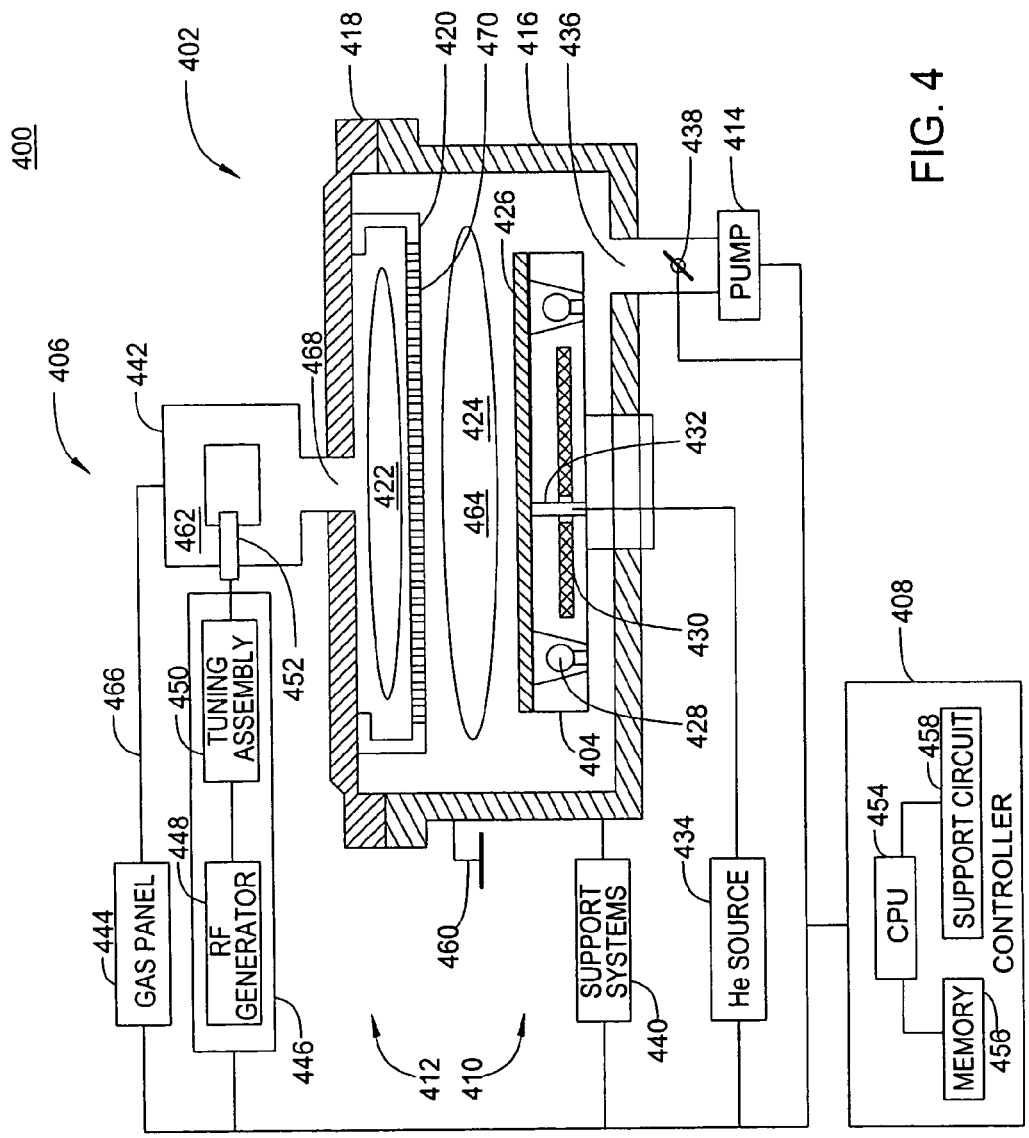
FIG. 4 depicts a schematic diagram of an exemplary etch mask strip apparatus of the kind used in performing portions of the inventive method.

FIG. 4 depicts a schematic diagram of the exemplary AXIOM™ reactor 400 that may be used to practice portions of the invention. The AXIOM™ reactor is generally used as a processing module of the CENTURA® semiconductor wafer processing system available from Applied Materials, Inc. of Santa Clara, Calif.

The reactor 400 comprises a process chamber 402, a remote plasma source 406, and a controller 408.

The process chamber 402 generally is a vacuum vessel, which comprises a first portion 410 and a second portion 412. In one embodiment, the first portion 410 comprises a substrate pedestal 404, a sidewall 416 and a vacuum pump 414. The second portion 412 comprises a lid 418 and a gas distribution plate (showerhead) 420. Together, the first portion 410 and the second portion 412 define a gas mixing volume 422 and a reaction volume 424. The lid 418 and sidewall 416 are generally formed of a metal (e.g., aluminum (Al), stainless steel, and the like) and are electrically coupled to a ground reference 460.

The substrate pedestal 404 supports a substrate (wafer) 426 within the reaction volume 424. In one embodiment, the substrate pedestal 404 may comprise a source of radiant heat, such as gas-filled lamps 428, as well as an embedded resistive heater 430 and a conduit 432. The conduit 432 provides a gas (e.g., helium) from a source 434 to the backside of the wafer 426 through grooves (not shown) formed in the pedestal 404 surface under the wafer 426. The gas facilitates heat exchange between the support pedestal 404 and the wafer 426. The temperature of the wafer 426 may be maintained between about 20 and 400 degrees Celsius.

The vacuum pump 414 is coupled to an exhaust port 436 formed in the sidewall 416 of the process chamber 402. The vacuum pump 414 is used to maintain a desired gas pressure in the process chamber 402, as well as evacuate the post-processing gases and other volatile compounds from the chamber. In one embodiment, the vacuum pump 414 uses a throttle valve 438 to control a gas pressure in the process chamber 402.

The process chamber 402 may also include conventional systems for retaining and releasing the wafer 426, detecting an end point of a process, internal diagnostics, and the like. Such systems are collectively depicted in FIG. 4 as support systems 440.

The remote plasma source 406 comprises a power source 446, a gas panel 444 and a remote plasma chamber 442. In one embodiment, the power source 446 comprises a radio-frequency (RF) generator 448, a tuning assembly 450 and an applicator 452. The RF generator 448 is capable of producing about 200 to 5000 W at a frequency of about 200 to 600 kHz. The applicator 452 is inductively coupled to the remote plasma chamber 442 and energizes a process gas (or gas mixture) 464 to form a plasma 462 in the chamber 442. In one embodiment, the remote plasma chamber 442 has a toroidal geometry that confines the plasma and facilitates efficient generation of radical species, as well as lowers the electron temperature of the plasma. In other embodiments, the remote plasma source 406 may be a microwave plasma source, however, the stripping rates are generally higher using the inductively coupled plasma.

The gas panel 444 includes a conduit 466 to deliver the process gas 464 to the remote plasma chamber 442. The gas panel 444 (or conduit 466) comprises means (not shown), such as mass flow controllers and shut-off valves for controlling gas pressure and flow rate for each individual gas supplied to the chamber 442. In the plasma 462, the process gas 464 is ionized and dissociated to form reactive species.

The reactive species are directed into the mixing volume 422 through an inlet port 468 in the lid 418. To minimize charge related plasma damage to devices on the wafer 426, the ionic species of the process gas 464 are substantially neutralized within the mixing volume 422 before the gas reaches the reaction volume 424 through a plurality of openings 470 in the showerhead 420.

The controller 408 comprises a central processing unit (CPU) 454, a memory 456 and support circuits 458. The CPU 454 may be one of any form of general-purpose computer processor used in an industrial setting. Software routines may be stored in the memory 456, such as random access memory, read only memory, floppy or hard disk, or other form of digital storage. The support circuits 458 are conventionally coupled to the CPU 454 and may comprise cache, clock circuits, input/output sub-systems, power supplies, and the like.

The software routines, when executed by the CPU 454, transform the CPU into a specific purpose computer (controller) 408 that controls the reactor 400 such that the processes are performed in accordance with the present invention. The software routines may also be stored and/or executed by a second controller (not shown) that is located remotely from the reactor 400.

Figure 5:
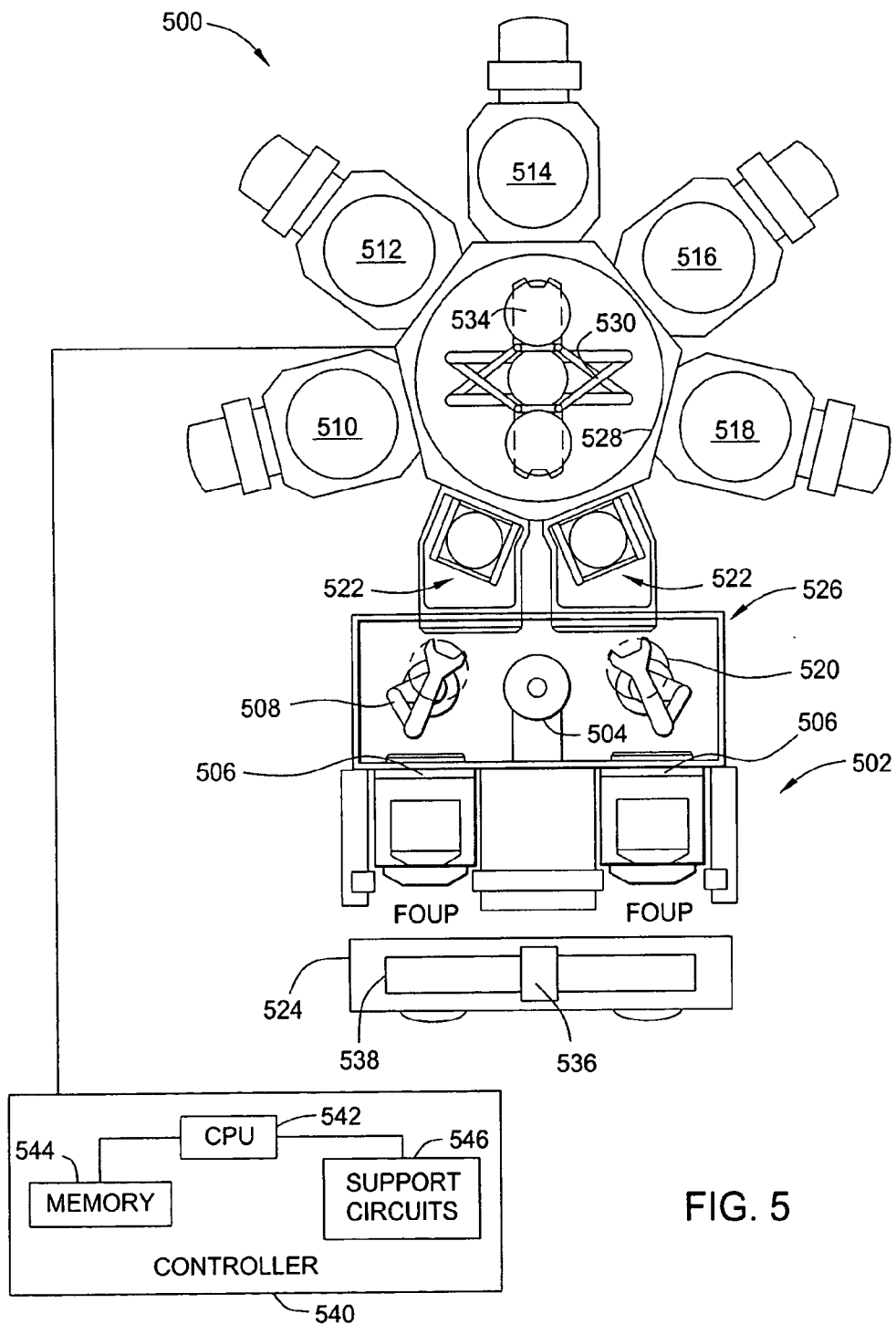
FIG. 5 depicts a schematic diagram of an exemplary integrated semiconductor substrate processing system of the kind used in performing portions of the inventive method.

FIG. 5 is a schematic, top plan view of the exemplary CENTURA® integrated processing system 500 that illustratively may be used to practice portions of the invention. The particular embodiment of the system 500 is provided to illustrate the invention and should not be used to limit the scope of the invention.

The integrated processing system 500 generally includes load-lock chambers 522, process modules 510, 512, 514, 516, 518, a vacuumed plenum 528, a robot 530, an input/output module 502, a metrology module 526, and a system controller 540. The load-lock chambers 522 are used as docking stations for cassettes with substrates and to protect the plenum 528 from atmospheric contaminants. The robot 530 having a wafer receptacle 534 transfers the substrates between the load lock chambers and process modules. The input/output module 502 comprises at least one front opening unified pod (FOUP) 506 (two FOUPs are depicted) facilitating an exchange of the cassettes with the substrates between a factory interface 524 and the metrology module 526.

The metrology module 526 comprises an optical measuring station 504 suitable for obtaining CD measurements and two substrate robots 508 and 520, which transfer pre-processed and post-processed substrates between the FOUP 506, the optical measuring station 504, and the load-lock chambers 522. One suitable metrology module is available from Nanometrics Incorporated, located in Milpitas, Calif.

The factory interface 524 is an atmospheric pressure interface used to transfer the cassettes with pre-processed and post-processed wafers between various processing systems and manufacturing regions of the semiconductor fab. Generally, the factory interface 524 comprises a substrate handling device 536 and a track 538. In operation, the substrate handling device 536 moves along the track 538.

The system controller 540 is coupled to and controls each module of the integrated processing system 500. Generally, the system controller 540 controls all aspects of operation of the system 500 using a direct control of modules and apparatus of the system 500 or, alternatively, by controlling the computers associated with these modules and apparatus. In operation, the system controller 540 enables feedback from the respective modules and apparatus to optimize substrate throughput.

The system controller 540 comprises a central processing unit (CPU) 542, a memory 544, and a support circuit 546. The CPU 542 may be one of any form of a general purpose computer processor that can be used in an industrial setting. The support circuit 546 is conventionally coupled to the CPU 542 and may comprise cache, clock circuits, input/output subsystems, power supplies, and the like. The software routines, when executed by the CPU 542, transform the CPU into a specific purpose computer (controller) 540. The software routines may also be stored and/or executed by a second controller (not shown) that is located remotely from the system 500.

At least one of the process modules of the integrated processing system 500 may be the DPS II module used to perform portions of the present invention. The system 500 may also comprise other processing modules, such as the PRECLEAN II™ plasma cleaning module, the AXIOM™ remote plasma module, the RADIANCE™ thermal processing module (these processing modules are available from Applied Materials, Inc. of Santa Clara, Calif.), and the like.

One example of a possible configuration of the system 500 for performing processes in accordance with the present invention is the TRANSFORMA™ processing system available from Applied Materials, Inc. The system 500 may include two load-lock chambers 522, DPS II modules 514, 516, and 518, the AXIOM™ modules 510 and 514, the metrology module 526 and the input/output module 502 comprising two FOUPs 506.

The invention may be practiced using other etch processes wherein parameters may be adjusted to achieve acceptable characteristics by those skilled in the art by utilizing the teachings disclosed herein without departing from the spirit of the invention. Although the forgoing discussion referred to fabrication of a field effect transistor, fabrication of the other devices and structures used in integrated circuits can also benefit from the invention.

While the foregoing is directed to the illustrative embodiment of the present invention, other and further embodiments of the invention may be devised without departing from the basic scope thereof, and the scope thereof is determined by the claims that follow.

What is claimed is:

1. A method for controlling accuracy and repeatability of an etch process, comprising:
   (a) providing a batch of substrates, each substrate having a patterned mask formed on a film stack comprising at least one material layer;
   (b) measuring dimensions of elements of the patterned mask on at least one substrate of the batch of substrates;
   (c) trimming the patterned mask on the at least one substrate using a process recipe based on the measurements performed at step (b), then;
   (d) etching the at least one material layer on the at least one substrate;
   (e) measuring a thickness of post-etch residue and at least one of compacting or removing at least a portion of the post-etch residue formed on sidewalls of the etched structures based on the thickness of the post-etch residue;
   (f) measuring dimensions of etched structures formed on the at least one substrate during step (d); and
   (g) adjusting the process recipe of step (c) or/and the process recipe of step (d); based on the measurements performed at step (f).

2. The method of claim 1 wherein the steps (b) and (f) use an optical measuring technique.

3. The method of claim 2 wherein the optical measuring technique is a scatterometric measuring technique.

4. The method of claim 1 wherein the steps (b) through (f) are performed using processing modules of a single substrate processing system.

5. The method of claim 1 wherein the step (g) further comprises:
   modifying a time duration or process parameters for trimming the patterned mask.

6. The method of claim 1 wherein the step (g) further comprises:
   modifying a time duration or process parameters for etching the material layer.

7. The method of claim 1 further comprising:
   thinning the post-etch residue to a thickness of less than about 10 nm.

8. A method for controlling accuracy and repeatability during formation of a gate structure of a field effect transistor, comprising:
   (a) providing a batch of substrates, each substrate having a patterned mask formed on a gate electrode layer of the gate structure;
   (b) measuring dimensions of elements of the patterned mask on at least one substrate of the batch of substrates;

(c) trimming the patterned mask on the at least one substrate using a process recipe based on the measurements performed at step (b), then;
(d) etching the gate electrode layer on the at least one substrate;
(e) measuring a thickness of post-etch residue and at least one of compacting or removing at least the portion of post-etch residue formed on sidewalls of the etched structures based on the thickness of the post-etch residue;
(f) measuring dimensions of etched gate electrode structures formed on the at least one substrate during step (d); and
(g) adjusting the process recipe of step (c) or/and the process recipe of step (d) based on the measurements performed at step (f).

9. The method of claim 8 wherein the steps (b) and (f) use an optical measuring technique.

10. The method of claim 9 wherein the optical measuring technique is a scatterometric measuring technique.

11. The method of claim 8 wherein the steps (b) through (f) are performed using processing modules of a single substrate processing system.

12. The method of claim 8 wherein the step (g) further comprises:
modifying a time duration or process parameters for trimming the patterned mask.

13. The method of claim 8 wherein the step (g) further comprises:
modifying a time duration or process parameters for etching the material layer.

14. The method of claim 8 wherein the gate electrode layer comprises doped polysilicon.

15. The method of claim 8 wherein the step (d) further comprises:
providing HBr and $Cl_2$ at a flow ratio HBr:$Cl_2$ in a range from 1:15 to 15:1.

16. The method of claim 8 further comprising: thinning the post-etch residue to a thickness of less than about 10 nm.

17. The method of claim 15 further comprising:
using a plasma comprising one or more gases selected from the group consisting of nitrogen ($N_2$), oxygen ($O_2$) and hydrogen ($H_2$).

18. The method of claim 17 further comprising:
providing nitrogen ($N_2$) and hydrogen ($H_2$) at a $N_2$:$H_2$ flow ratio in a range from 3:1 to 100% of $N_2$;
maintaining the substrate at a temperature between about 200 and 350 degrees Celsius;
applying power to an inductively coupled power source between about 1000 and 7000 W; and
maintaining a chamber pressure between about 500 and 2000 mTorr.

19. The method of claim 1, wherein the step (e) further comprises:
measuring a critical dimension of a feature is done in addition to measuring the thickness of the post-etch residue.

20. The method of claim 8, wherein the step (e) further comprises:
measuring a critical dimension of a feature is done in addition to measuring the thickness of the post-etch residue.

* * * * *

UNITED STATES PATENT AND TRADEMARK OFFICE
CERTIFICATE OF CORRECTION

| | | |
|---|---|---|
| PATENT NO. | : 7,094,613 B2 | Page 1 of 1 |
| APPLICATION NO. | : 10/690318 | |
| DATED | : August 22, 2006 | |
| INVENTOR(S) | : David Mui, Wei Liu and Hiroki Sasano | |

It is certified that error appears in the above-identified patent and that said Letters Patent is hereby corrected as shown below:

On the Title Page

Item [57], Abstract, Line 6: Change the semicolon after "feature" to a comma

Item [57], Abstract, Line 10: Change "improved" to --improve--

Column 1, Line 65: Change the semicolon after "feature" to a comma

Column 2, Line 2: Change "improved" to --improve--

Column 2, Line 64: Change "improved" to --improve--

Column 6, Line 23: After "less", insert --than--

Column 7, Line 37: Change "reactors" to --reactor,--

Column 12, Line 8: Change "forgoing" to --foregoing--

Signed and Sealed this

Seventeenth Day of October, 2006

JON W. DUDAS
*Director of the United States Patent and Trademark Office*